Oct. 9, 1951 R. G. LEGROS 2,570,461
STANDARD FREQUENCY GENERATOR
Filed June 18, 1947
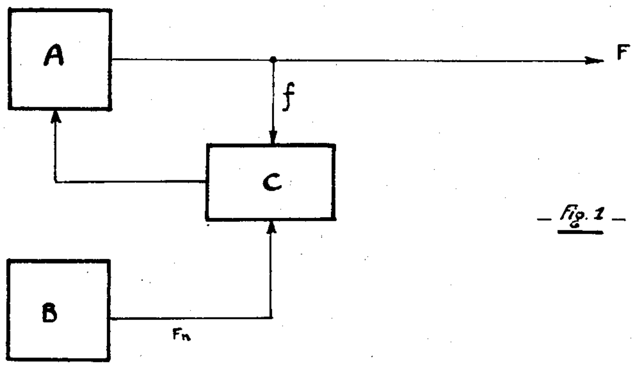
– Fig. 1 –
– Fig. 2 –
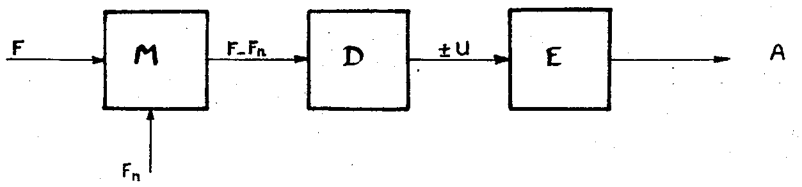
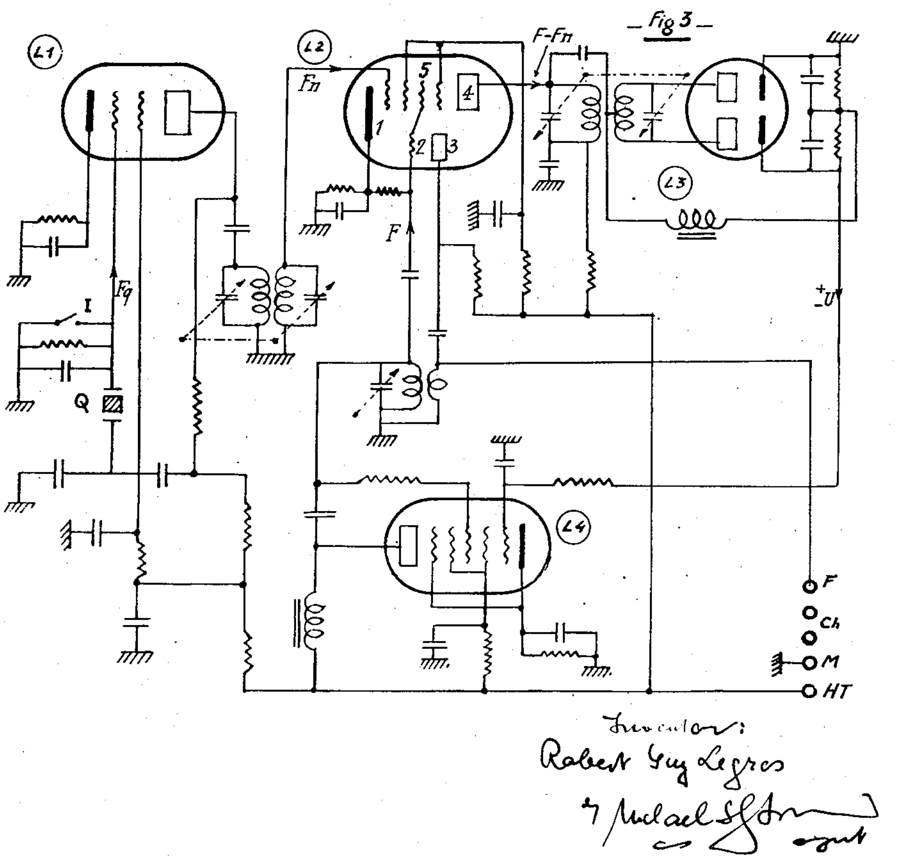
– Fig 3 –
Inventor:
Robert Guy Legros
by Michael [illegible] agent Patented Oct. 9, 1951 2,570,461

UNITED STATES PATENT OFFICE 2,570,461

STANDARD FREQUENCY GENERATOR

Robert Guy Legros, Paris, France

Application June 18, 1947, Serial No. 755,294
In France September 20, 1946

4 Claims. (Cl. 250—36)

My invention has for its object an arrangement of reduced bulk forming a pilot or a standard frequency generator the accuracy of which approximates that of quartz and that covers uninterruptedly a considerable range of frequencies.

My invention has for its object the provision of a single quartz adapted to produce any desired frequency selected from the range covered by the system, said frequency being defined with a high accuracy under a voltage of a few volts while being practically devoid of parasitic oscillations and its value being directly readable with great accuracy.

In the drawings affixed to this specification and forming part thereof an embodiment of my invention is illustrated diagrammatically by way of example.

Figs. 1 and 2 show a diagram illustrating the component parts of the system forming my invention.

Fig. 3 is a wiring diagram of a preferred form

According to my invention, the usual frequency F produced by a generator A allowing continuous variation of frequency is associated at C with a frequency F*n* which is a harmonic *n* of the frequency of a quartz oscillator B having a frequency F*q*.

Any deviation of the frequency F from the selected frequency F*n* of reference is utilized for acting at C (Fig. 1) by counterreaction and making C in its turn act on A in order to bring about stabilization.

The stabilization at any point of the range is obtained by comparing the frequency $F \pm \Delta F - Fn \pm \Delta Fn$ to the tuning frequency $Fd = F - Fn$ of a system wherein a shifting *f* of the frequency introduced into it modifies automatically, efficiently and in the required direction the tuning of the generator A producing F.

In order that the shifting of F*d* may be much smaller than that of F, the circuits used although very carefully executed being of the same type as those used for A, the following inequality should be respected: $Fd \ll F$.

F*d* is continuously adjustable between two limits such that F*d* max−F*d* min$\geqslant F(n+1) - Fn = Fq$ (frequency of the quartz); thus it is also possible by suitably choosing the harmonic F*n* of F*q* to tune F*d* to F−F*n* and to ensure the stabilisation of F.

In the detail of C (Fig. 1) given out in Fig. 2, I use a mixer M of any type whatever inside which F and F*n* are associated for producing the frequency $F - Fn = Fd$ which is applied to a system D tuned to F*d*, termed the discriminator and adapted to transform the shifting of said frequency into a continuous voltage ±U.

This voltage is applied to the system E forming a frequency corrector. The latter as soon as it is submitted to a voltage ±U alters the tuning of the generator A so as to reduce its frequency shifting.

Fig. 3 shows a form of execution of the system according to Fig. 1.

In the wiring diagram the three parts A, B, C, of Fig. 1 are constituted in the following manner:

Part B is constituted by a quartz oscillator L1 producing the harmonics F*n* of the frequency F*q* of the quartz Q.

The part A is constituted by a stabilized self oscillator producing the useful frequency F and acting also as a mixer. This self oscillator is constituted by the vacuum tube L2 considered as operating as a three electrode tube comprising a portion of the filament 1, a grid 2 and an anode 3.

Lastly the part C including in the case of Fig. 2 the three parts M, D and E is constituted as follows in the case of Fig. 3:

*a.* The mixer M constituted by the other part of the filament 1 of the tube L2, the anode 4 and the cooperating grids, the first grid receiving the frequency F*n* from the tube L1 while the anode 4 delivers the frequencies F−F*n*, the frequency F being applied to the series grids 2 and 5 of the tube L2.

*b.* The part D is constituted by a double diode L3 receiving the frequency F−F*n* produced by the tube L2 and producing in its turn the voltage ±U of constant polarity.

The part E or frequency corrector is constituted by the vacuum tube L4 receiving the voltage ±U on its output grid in order to modify the tuning of the oscillator L1.

HT designates the high voltage feed for the different vacuum tubes.

The advantages provided by the form of execution according to Fig. 3 or through the application of the above described principles and the chief possible fields of use are as follows:

a. A single reference quartz allows stabilizing with an accuracy approximating the very stability of the quartz, a generating oscillator throughout an extended range of frequencies.

b. Any suitable frequency of the range covered by the system may be defined through simple reading without any control apparatus by reason of the accuracy of the vernier formed by the discriminator.

c. The pliability of the arrangement is due to the continuous variation in the frequency of the generator and vernier discriminator.

d. Any desired frequency is practically pure and shows neither hisses nor beats.

e. The useful voltage may be equal to several volts at any point of the frequency range considered.

f. The bulk may be reduced in practice to that of the variable condensers and of the controlling and indicating members.

g. The consumption of energy of the system illustrated in Fig. 3 is of the order of 15 watts and may even be reduced to 10 watts.

h. The apparatus may be associated directly with any receiver or transmitter station, or with a transmitting and receiving station for defining its frequency and allowing a simplification in the amplifier chain while doing away with the local oscillator and allowing the transmission or the reception at any moment at a predetermined well defined frequency.

What I claim is:

1. A frequency generator in which the frequency generated by a tunable oscillating circuit is stabilized by a crystal-containing circuit having a mixer generating the difference of the frequencies of the tunable oscillating circuit and the crystal containing circuit and a discriminator responding to the difference of the frequencies, in combination, a first adjustable condenser in the output circuit of the crystal-containing circuit; a second adjustable condenser in a grid circuit of the mixer; means for adjusting simultaneously said first and second condensers; means for electrically coupling said first and second condensers to each other; a third adjustable condenser in the output circuit of said mixer; a fourth adjustable condenser in the input circuit of the discriminator; means for adjusting said third and fourth condensers simultaneously; and means for electrically coupling said third and fourth condensers to each other.

2. A frequency generator in which the frequency generated by a tunable oscillating circuit is stabilized by a crystal-containing circuit having a mixer generating the difference of the frequencies of the tunable oscillating circuit and the crystal-containing circuit and a discriminator responding to the difference of the frequencies, in combination, a first tunable circuit in the output circuit of the crystal-containing circuit; said first tunable circuit including a first adjustable condenser and a first inductance; a second tunable circuit in a grid circuit of the mixer, said second tunable circuit including a second adjustable condenser and a second inductance, said first and second inductances being electrically coupled to each other; means for adjusting simultaneously said first and second condensers; a third tunable circuit in the output circuit of said mixer, said third tunable circuit including a third adjustable condenser and a third inductance; a fourth tunable circuit in the input circuit of the discriminator, said fourth tunable circuit including a fourth adjustable condenser and a fourth inductance, said third and fourth inductances being electrically coupled to each other; and means for adjusting simultaneously said third and fourth condensers.

3. A frequency generator in which the frequency generated by a tunable oscillating circuit is stabilized by a crystal-containing circuit having a mixer generating the difference of the frequencies of the tunable oscillating circuit and the crystal-containing circuit and a discriminator responding to the difference of the frequencies, in combination, a first tunable circuit in the output circuit of the crystal-containing circuit; said first tunable circuit including a first adjustable condenser and a first inductance; a second tunable circuit in a grid circuit of the mixer, said second tunable circuit including a second adjustable condenser and a second inductance, said first and second inductances being electrically coupled to each other; means for adjusting simultaneously said first and second condensers; a third tunable circuit in the output circuit of said mixer, said third tunable circuit including a third adjustable condenser and a third inductance; a fourth tunable circuit in the input circuit of the discriminator, said fourth tunable circuit including a fourth adjustable condenser and a fourth inductance, said third and fourth inductances being electrically coupled to each other; means for adjusting simultaneously said third and fourth condensers; a fifth tunable circuit forming part of the tunable oscillating circuit delivering the desired stabilized oscillating frequency; and a reactance tube having a grid and an anode, said grid of said reactance tube being connected to the output of the discriminator, said anode of said reactance tube being connected to said fifth tunable circuit.

4. A frequency generator in which the frequency generated by a tunable oscillating circuit is stabilized by a crystal-containing circuit having a mixer generating the difference of the frequencies of the tunable oscillating circuit and the crystal-containing circuit and a discriminator responding to the difference of the frequencies adapted to be tuned for frequencies the difference between which is equal to the basic frequency of said crystal, in combination, a first tunable circuit in the output circuit of the crystal-containing circuit in order to select any one of the desired multiples of the basic crystal frequency, said first tunable circuit including a first adjustable condenser and a first inductance; a second tunable circuit in a grid circuit of the mixer, said second tunable circuit including a second adjustable condenser and a second inductance, said first and second inductances being electrically coupled to each other; means for adjusting simultaneously said first and second condensers; a third tunable circuit in the output circuit of said mixer, said third tunable circuit including a third adjustable condenser and a third inductance; a fourth tunable circuit in the input circuit of the discriminator, said fourth tunable circuit including a fourth adjustable condenser and a fourth inductance, said third and fourth inductances being electrically coupled to each other; means for adjusting simultaneously said third and fourth condensers; a fifth tunable circuit forming part of the tunable oscillating circuit delivering the desired stabilized oscillating frequency; and a reactance tube having a grid and an anode, said grid of said reactance tube being connected to the output of the discriminator, said anode of said reactance tube being coupled to said fifth tunable circuit.

ROBERT G. LEGROS.

REFERENCES CITED

The following references are of record in the file of this patent:

UNITED STATES PATENTS

| Number | Name | Date |
|---|---|---|
| 2,031,100 | Engel | Feb. 18, 1936 |
| 2,096,881 | Butler | Oct. 26, 1937 |
| 2,173,301 | Kinross | Sept. 19, 1939 |
| 2,210,781 | Shofstall | Aug. 6, 1940 |
| 2,245,627 | Varian | June 17, 1941 |
| 2,247,544 | Daily | July 1, 1941 |
| 2,265,083 | Peterson | Dec. 2, 1941 |
| 2,368,643 | Crosby | Feb. 6, 1945 |
| 2,396,688 | Crosby | Mar. 19, 1946 |
| 2,404,852 | Koch | July 30, 1946 |
| 2,406,125 | Ziegler et al. | Aug. 20, 1946 |
| 2,407,863 | Ziegler | Sept. 17, 1946 |
| 2,427,204 | Ferguson | Sept. 8, 1947 |
| 2,455,824 | Tellier | Dec. 7, 1948 |